(12) United States Patent
Deng et al.

(10) Patent No.: US 7,848,037 B2
(45) Date of Patent: Dec. 7, 2010

(54) MEDIA DEFECT REMOVAL IN DISK DRIVE HEAD TESTING

(75) Inventors: Youping Deng, Saratoga, CA (US); Terry Farren, Fremont, CA (US); Jing Zhang, San Jose, CA (US)

(73) Assignee: Hitachi Global Storage Technologies, Netherlands, B.V., Amsterdam (NL)

( * ) Notice: Subject to any disclaimer, the term of this patent is extended or adjusted under 35 U.S.C. 154(b) by 416 days.

(21) Appl. No.: 11/986,234

(22) Filed: Nov. 19, 2007

(65) Prior Publication Data

US 2009/0128142 A1 May 21, 2009

(51) Int. Cl.
G11B 27/36 (2006.01)

(52) U.S. Cl. .............................. 360/31; 360/25; 324/212
(58) Field of Classification Search .................. None
See application file for complete search history.

(56) References Cited

U.S. PATENT DOCUMENTS

| | | | |
|---|---|---|---|
| 6,043,945 A | 3/2000 | Tsuboi et al. | |
| 6,366,081 B1 | 4/2002 | Tan et al. | |
| 6,381,710 B1 | 4/2002 | Kim | |
| 6,657,428 B2 | 12/2003 | Kim | |
| 6,731,442 B2 | 5/2004 | Jin et al. | |
| 6,873,488 B2 | 3/2005 | Teo et al. | |
| 6,898,033 B2 * | 5/2005 | Weinstein et al. | 360/31 |
| 6,956,710 B2 | 10/2005 | Yun et al. | |
| 6,993,688 B2 * | 1/2006 | Su et al. | 714/704 |
| 7,064,539 B2 * | 6/2006 | Green et al. | 324/210 |
| 2004/0041559 A1 | 3/2004 | Fang et al. | |
| 2007/0046286 A1 | 3/2007 | Umezaki et al. | |

FOREIGN PATENT DOCUMENTS

EP 0429435 5/1991

OTHER PUBLICATIONS

Ber, et al., "Bit Error Rate (BER) Module for WITE32", *Guzik Technical Enterprises*, (2007), 1-4.
Row, Martin "Measure a Disk-Drive's Read Channel Signals", *Test & Measurement World*, (Aug. 1, 1999), 1-8.
Lam, et al., "A Study of ESD Sensitivities of Bottom-Synthetic Recording Heads", *IEEE Transactions on Magnetics* vol. 36, Iss.5, (Sep. 2000), 1-1.
Lam, et al., "A Study of ESD Sensitivity in AMR and GMR Recording Heads", *Electrostatic Discharge Symposium Proceedings*, vol., Iss., 6-8, (Oct. 1998), 1-1.
Arnett, et al., "High Data Rate Recording At Over 60 Mbytes Per Second", *IEEE Transactions on Magnetics*, vol. 35 iss.5 (Sep. 1999), 1-1.
Program URL, et al., "Physical Bad Sector Software", *Program URL.com: The Best Software Resource*, (2007), 1-4.
PC Win, et al., "Best Flobo Hard Disk Repair", *PCWin Download Center*, (1995-2007), 1-2.

* cited by examiner

*Primary Examiner*—Jason C Olson

(57) ABSTRACT

A method for testing a hard disk drive is described. The method includes determining a number of defects associated with a portion of recordable media associated with a hard disk drive. The method further includes comparing the number of determined defects to a threshold number of defects and provided the number of determined defects is greater than the threshold number of defects, determining that the portion of the disk comprises disk defects.

18 Claims, 8 Drawing Sheets

500

---

Determining a number of errors associated with a portion of recordable media associated with a hard disk drive
502

---

Comparing the number of determined errors to a threshold number of errors
504

---

Provided the number of determined errors is greater than the threshold number of errors, determining that the portion of the disk comprises disk defects
506

Receiving a plurality of test results associated with a plurality of portions of recordable media of a hard disk drive
602

Comparing the plurality of test results to a threshold value
604

Filtering results of the plurality of test results that exceed the threshold value
606

Determining a disk drive head performance based on results of the plurality of the test results that are less than the threshold value
608

FIG. 6

MEDIA DEFECT REMOVAL IN DISK DRIVE HEAD TESTING

TECHNICAL FIELD

This invention relates generally to the field of direct access storage devices and in particular to improved head testing of hard disk drives.

BACKGROUND ART

Direct access storage devices (DASD) have become part of every day life, and as such, expectations and demands continually increase for greater speed for manipulating data and for holding larger amounts of data. To meet these demands for increased performance, the mechanical assembly in a DASD device, specifically the Hard Disk Drive (HDD) has undergone many changes.

Many times the HDD is tested to determine performance of the HDD. Bit/byte error rate (BER) test is one testing method used for evaluating recording head performance. One problem with performing a BER test is that it is difficult to distinguish between disk errors and recording head errors which can lead to unreliable test results that can lead to decreased manufacturing yields.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

A method for testing a recording head of a hard disk drive is described. The method includes determining a number of defects associated with a portion of recordable media associated with a hard disk drive. The method further includes comparing the number of determined defects to a threshold number of defects and provided the number of determined defects is greater than the threshold number of defects, determining that the portion of the disk comprises disk defects.

BRIEF DESCRIPTION OF THE DRAWINGS

FIG. 5 is a flow diagram of an exemplary method for testing a hard disk drive in accordance with one embodiment of the present invention.

FIG. 6 is a flow diagram of an exemplary method for testing a recording head of a hard disk drive including filtering media defects in accordance with one embodiment of the present invention.

BEST MODES FOR CARRYING OUT THE INVENTION

Reference will now be made in detail to the alternative embodiment(s) of the present invention. While the invention will be described in conjunction with the alternative embodiment(s), it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

The discussion will begin with an overview of a HDD and components connected therewith. The discussion will then focus on embodiments of a method and system for testing performance of a head by removing media defects. In one embodiment of the invention, test results of a head performance test are compared to a threshold value. Results that exceed the threshold value are removed from the test results and the remaining results are used to determine performance of a read head. In another embodiment, the threshold value is dynamically determined based on the test results.

Overview

In general, bit/byte error rate (BER) test is one of the most effective testing methods for recording head performance evaluation. When a head is tested for BER performance in dynamic-electrical test (DET), media defects affect the result significantly. Embodiments of the present invention separate the media defect contribution and the recording head performance in order to more accurately test the head performance. The improved testing can result in increased manufacturing yields.

During the BER test, the error counts (or error rates) are collected by sectors of which a data track is made. Error counts in each sector are compared with other sectors and itself in previous revolutions. A threshold value, either fixed or dynamically determined, is set for hard media defects for the sectors that have much higher error counts (or error rates) and repeatable in revolutions as the test media is rotated on the tester. Hard media defects are removed during the test and pure head BER test results are reported. In one embodiment, the threshold value is determined in software. In another embodiment, the media defects are removed from the test results by software. In one embodiment, the entire process of testing and removing media defects is performed in real-time during the testing.

Operation

Figure 1:
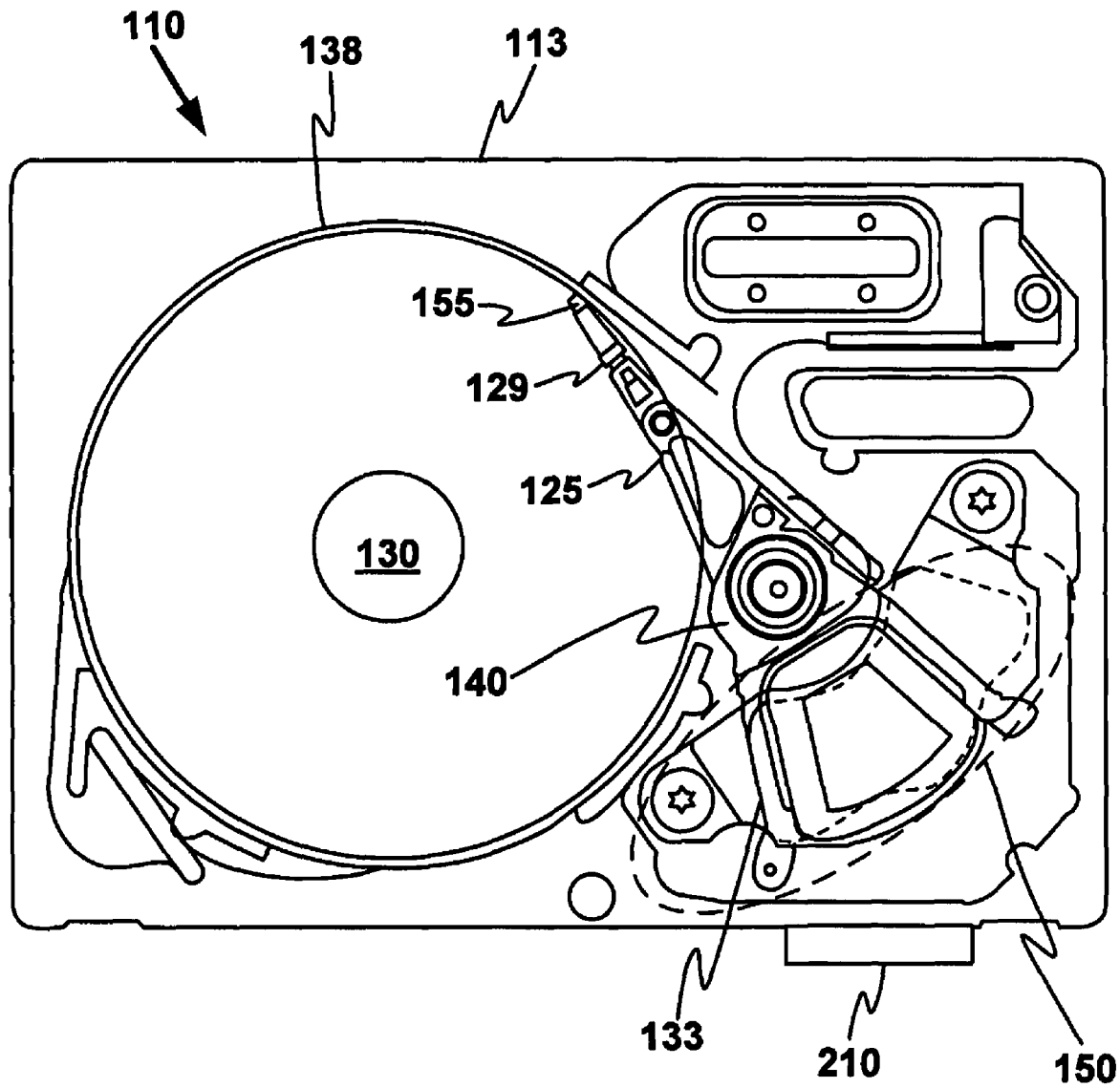
FIG. 1 is a plan view of an HDD with cover and top magnet removed in accordance with one embodiment of the present invention.

With reference now to FIG. 1, a schematic drawing of one embodiment of an information storage system including a magnetic hard disk file or HDD 110 for a computer system is shown. Although, only one head and one disk surface combination are shown. What is described herein for one head-disk combination is also applicable to multiple head-disk combinations. In other words, the present technology is independent of the number of head-disk combinations.

In general, HDD 110 has an outer housing 113 usually including a base portion (shown) and a top or cover (not shown). In one embodiment, housing 113 contains a disk pack having at least one media or magnetic disk 138. The disk pack (as represented by disk 138) defines an axis of rotation and a radial direction relative to the axis in which the disk pack is rotatable.

A spindle motor assembly having a central drive hub 130 operates as the axis and rotates the disk 138 or disks of the disk pack in the radial direction relative to housing 113. In one embodiment, the drive hub 130 is coupled with the housing 113 with a high conductive adhesive (not shown). An actuator assembly 140 includes one or more actuator arms 125. When a number of actuator arms 125 are present, they are usually represented in the form of a comb that is movably or pivotally mounted to base/housing 113. A controller 150 is also mounted to base 113 for selectively moving the actuator arms 125 relative to the disk 138. Actuator assembly 140 may be coupled with a connector assembly 210, which is utilized to convey data between arm electronics and a host system, such as a computer, wherein HDD 110 resides. In one embodiment of the invention, the exemplary high conductive adhesive is used to suppress interference signals inside the disk drive 110 by providing a low resistance path between the drive hub 130 and the housing 113.

In one embodiment, each arm 125 has extending from it at least one cantilevered integrated lead suspension (ILS) 129. The ILS 129 may be any form of lead suspension that can be used in a data access storage device. The slider 155 is usually bonded to the end of ILS 129. The level of integration containing the slider 155, ILS 129, and read/write head is called the Head Gimbal Assembly (HGA). In one embodiment of the invention, the exemplary high conductive adhesive suppresses interference signals from the ILS by providing a low resistance path between the drive hub 130 and the housing 113.

The ILS 129 has a spring-like quality, which biases or presses the air-bearing surface of slider 155 against disk 138 to cause slider 155 to fly at a precise distance from disk 138. ILS 129 has a hinge area that provides for the spring-like quality, and a flexing interconnect that supports read and write traces and electrical connections through the hinge area. A voice coil 133, free to move within a conventional voice coil motor magnet assembly is also mounted to actuator arms 125 opposite the head gimbal assemblies. Movement of the actuator assembly 140 by controller 150 causes the head gimbal assembly to move along radial arcs across tracks on the surface of disk 138.

Embodiments of the present invention can be used in the testing of hard disk drives. Many different testing systems can be used for testing the recording head of a hard disk drive including a spinstand tester which is a dynamic electrical tester.

Figure 2:
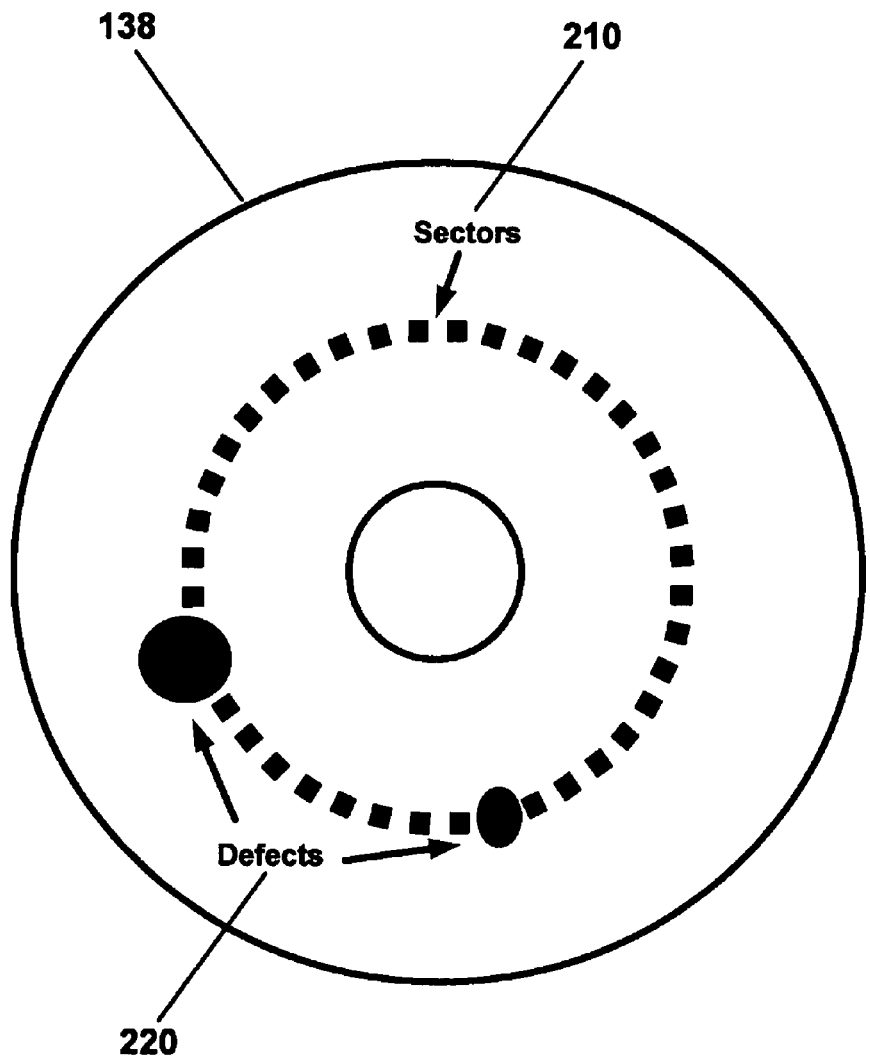
FIG. 2 is an illustration of a recordable disk in accordance with one embodiment of the present invention.

FIG. 2 is an illustration of a recordable disk 138 in accordance with one embodiment of the present invention. During a disk drive performance test, the test track on the disk surface is divided into sectors 210 which are composed of a certain number of bits or bytes. Each sector corresponds to a small portion of the disk surface area, physically. Embodiments of the present invention enable distinction between disk or media defects 220 and errors associated with the performance of the read/write head.

Error counts are determined by sectors, for each revolution as the test disk is rotating on the tester. If a media defect 220 is present for a given sector 210, over numerous revolutions, the number of errors identified for that particular sector will be considerably larger than the number of errors determined for a sector that does not include media defects.

Figure 3A:
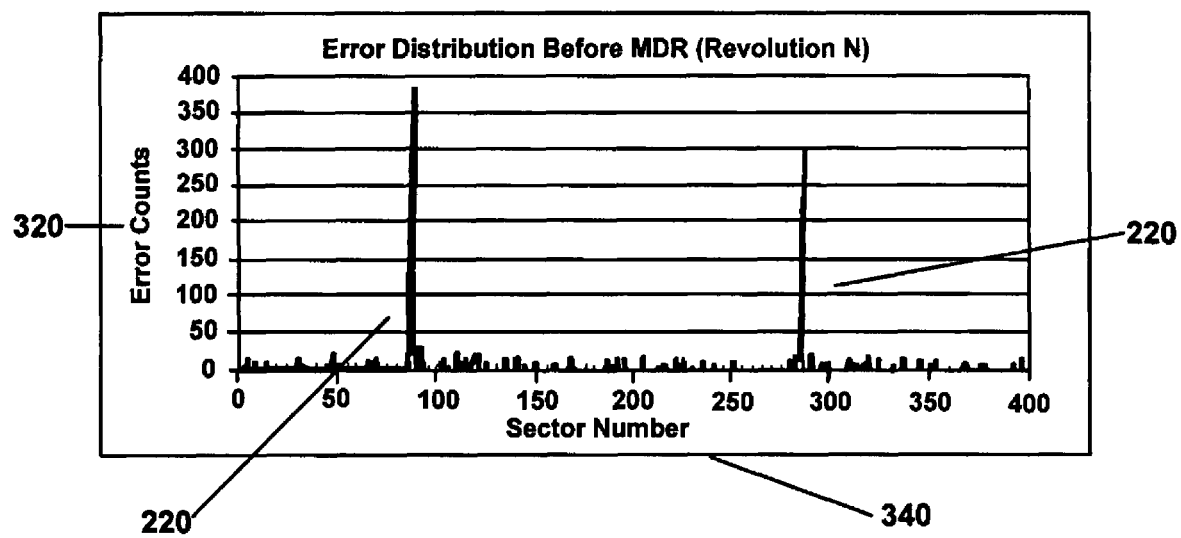
FIG. 3A is a chart illustrating error counts at the nth revolution associated with a plurality of sectors of a hard disk in accordance with one embodiment of the present invention.

FIG. 3A is a chart 300A illustrating error counts 320 at the nth revolution associated with a plurality of sectors 340 of a hard disk for N revolutions in accordance with one embodiment of the present invention. Error counts in sectors which are much larger 220 than other sectors and repeat in the same sectors are due to disk surface defects. In one embodiment, the number of errors 320 will approach N (meaning N revolutions) when a defect is present on a particular sector of the disk. Sectors that do not have disk defects will have significantly fewer errors compared to sectors with disk defects 220. Embodiments of the present invention filter error counts that are associated with disk defects when determining head performance.

Defects are usually generated by the head-disk interference interaction, wear, mishandling, and material imperfection. Media defects are the characteristic of the test disk and thus do not represent the recording head performance and should be removed to determine an accurate and true head performance. Embodiments of the present invention remove results 220 that are deemed to be associated with media defects when determining disk drive head performance to more accurately determine the true performance of a given head. This improves manufacturing throughput and efficiency.

Figure 3B:
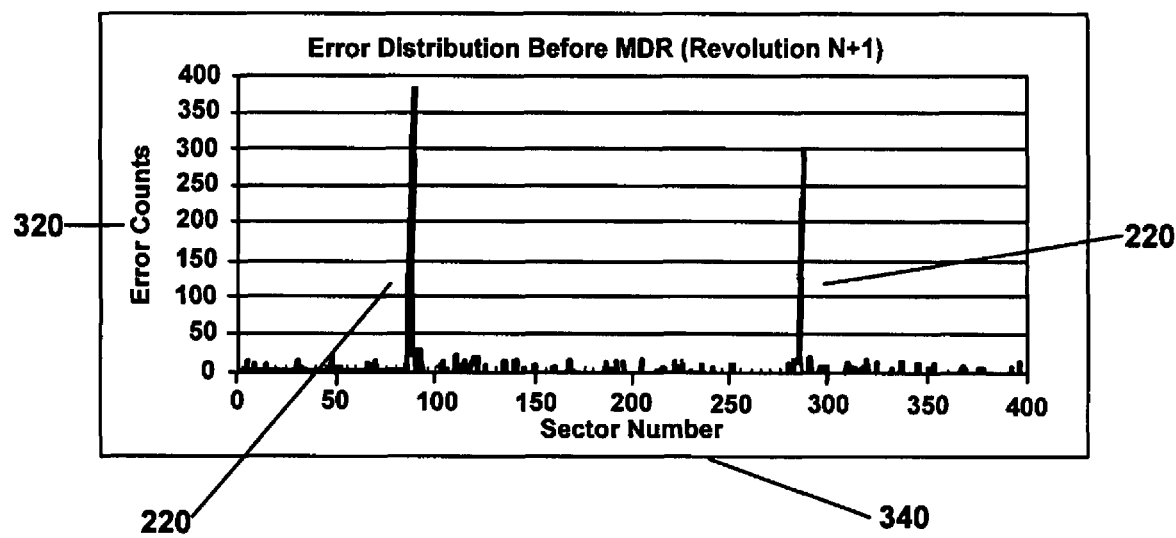
FIG. 3B is a chart illustrating error counts at the (n+1)th revolution associated with a plurality of sectors of a hard disk in accordance with one embodiment of the present invention.

FIG. 3B is a chart 300B illustrating error counts at the (n+1)th revolution associated with a plurality of sectors of a hard disk for N+1 revolutions in accordance with one embodiment of the present invention. As stated above, error counts in sectors which are much larger 220 than other sectors and repeat in the same sectors are due to disk surface defects. The number of errors 320 will approach N+1 (meaning N+1 revolutions) when a defect is present on a particular sector. Sectors that do not have disk defects will have significantly fewer errors compared to sectors with disk defects 220.

The media defect removal of the present invention sets a threshold value for the error counts, above which the sector is considered to be a media defect and its contribution is excluded from the BER calculation. The threshold value can be set dynamically during the test and automatically adjusted in real time based on the error count data. A stop limit can also be set to avoid over-removing sectors.

In one embodiment of the present invention, the threshold value is dynamic. In some cases, a dynamic threshold value is more effective than a fixed threshold value. In one embodiment, the dynamic threshold value is determined based on the sigma value of the sector error counts. For example, the dynamic threshold value can be determined as M*(Sigma of sector error counts) where M is a preset value. In one embodiment, M is six.

Figure 4:
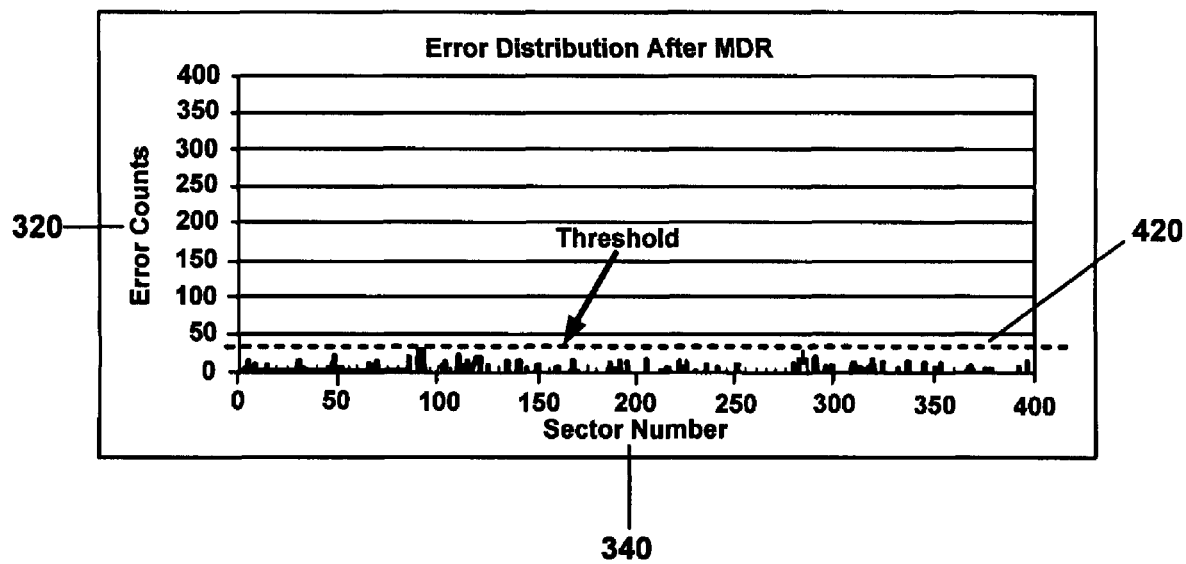
FIG. 4 is a chart illustrating error counts associated with a plurality of disk sectors after removing media errors in accordance with embodiments of the present invention.

FIG. 4 is a chart 400 illustrating error counts 320 associated with a plurality of disk sectors 340 after removing media errors in accordance with embodiments of the present invention. In this example, a threshold limit 420 has been used to remove values 220 (of FIGS. 3A and 3B) so that these results do not skew the head performance test results. Error counts that are determined to exceed the threshold 420 are deemed to be errors that are associated with the disk surface and are not used to determine head performance.

FIG. 5 is a flow diagram of an exemplary method 500 for testing a hard disk drive in accordance with one embodiment of the present invention. In one embodiment, method 500 is implemented in software executed by a computer system.

At 502, method 500 includes determining a number of errors associated with a portion of recordable media associated with a hard disk drive. In one embodiment, the number of errors is associated with BER test results of a disk sector. In one embodiment, the number of errors is provided for N number of revolutions of a particular hard disk.

At 504, method 500 includes comparing the number of determined errors to a threshold number of errors. In one embodiment, the threshold is dynamically determined based on the number of errors determined in 502. In another embodiment, the threshold value is pre-determined.

At 506, provided the number of errors is greater than the threshold number of errors, determining that the portion of the disk comprises disk defects. In other words, for a given disk sector, the number of errors of that particular sector can be compared to a threshold value to determine if the number of errors for that particular sector should be used in the calculation of the head performance.

If the number of errors exceeds the threshold value, the number of errors for that sector is not used for calculating the error rate of a particular head. If the number of errors is less than the threshold value, the number of errors for that particular sector is used for evaluating the performance of the head.

FIG. 6 is a flow diagram of an exemplary method 600 for testing a hard disk drive including filtering media defects in accordance with one embodiment of the present invention. In one embodiment, method 600 is implemented in software executed by a computer system.

At 602, method 600 includes receiving a plurality of test results associated with a plurality of portions of recordable media of a hard disk drive. In one embodiment, error counts for particular sectors are provided. In one embodiment, a BER test us used to generate the test results received in 602.

At 604, method 600 includes comparing the plurality of test results to a threshold value. In one embodiment, the threshold value is dynamically determined based on the test results received in 602. In another embodiment, the threshold value is pre-determined.

At 606, method 600 includes filtering results of the plurality of results that exceed the threshold value. In one embodiment, results that exceed the threshold value are determined to be associated with disk defects and test results that are less than the threshold value are determined to be associated with head performance. Test results that are less than the threshold value can be used to calculate a head error rate.

At 608, 600 includes determining a disk drive head performance based on the results of the plurality of results that are less than the threshold value. Values that exceed the threshold value are excluded from the head performance determination.

Exemplary Computer System

Figure 7:
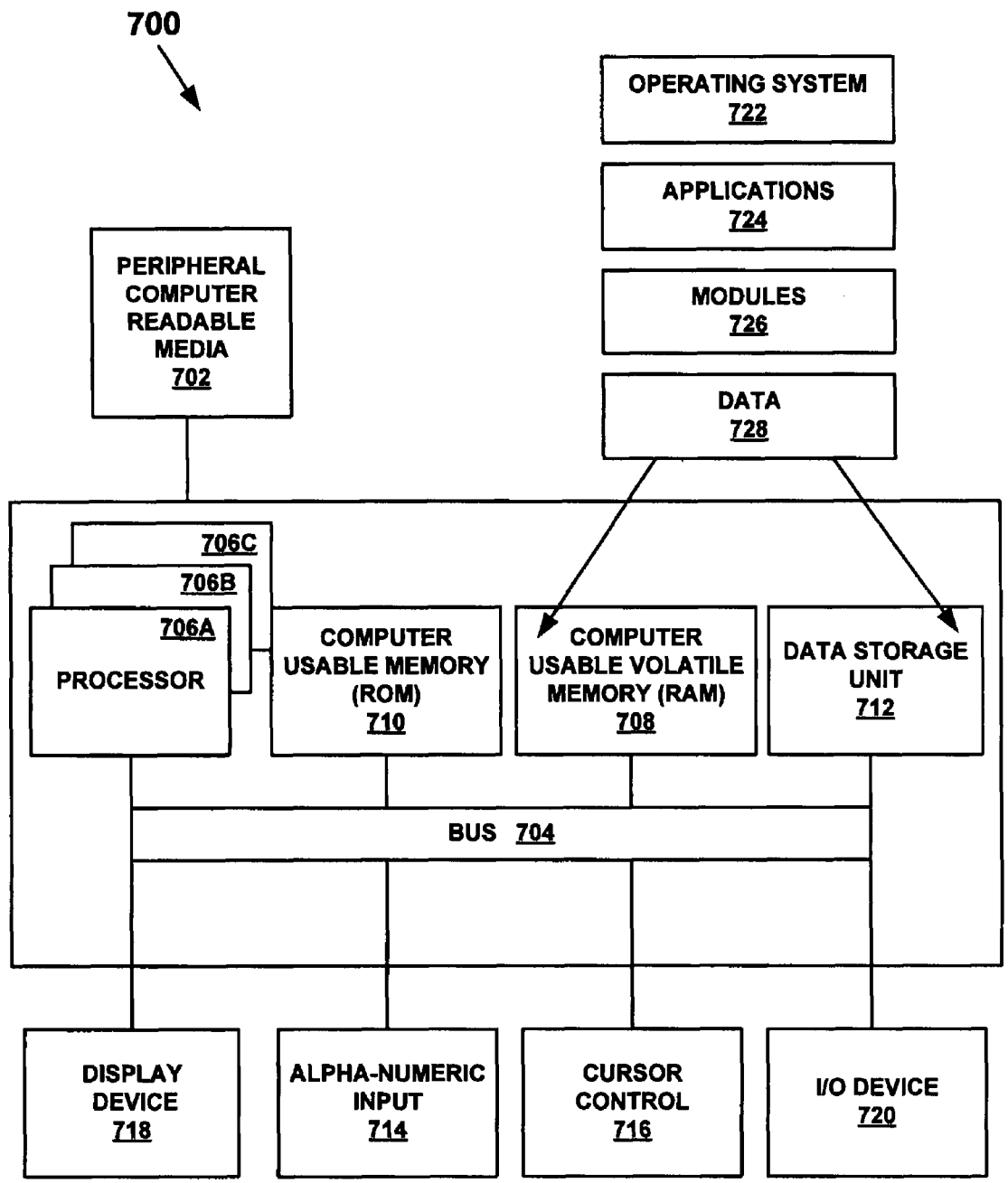
FIG. 7 is an illustration of a computer system for removing media defects in hard drive head testing in accordance with embodiments of the present invention.

With reference now to FIG. 7, portions of the technology for removing media defects in hard drive head testing are composed of computer-readable and computer-executable instructions that reside, for example, in computer-usable media of a computer system. That is, FIG. 7 illustrates one example of a type of computer that can be used to implement embodiments, which are discussed below, of the present technology for reducing blur.

FIG. 7 illustrates an exemplary computer system 700 used in accordance with embodiments of the present technology for removing media defects in hard drive head testing. It is appreciated that system 700 of FIG. 7 is exemplary only and that the present technology for removing media defects in hard drive head testing can operate on or within a number of different computer systems including general purpose networked computer systems, embedded computer systems, routers, switches, server devices, consumer devices, various intermediate devices/artifacts, stand alone computer systems, and the like. As shown in FIG. 7, computer system 700 of FIG. 7 is well adapted to having peripheral computer readable media 702 such as, for example, a floppy disk, a compact disc, and the like coupled thereto.

System 700 of FIG. 7 includes an address/data bus 704 for communicating information, and a processor 706A coupled to bus 704 for processing information and instructions. As depicted in FIG. 7, system 700 is also well suited to a multi-processor environment in which a plurality of processors 706A, 706B, and 706C are present. Conversely, system 700 is also well suited to having a single processor such as, for example, processor 706A. Processors 706A, 706B, and 706C may be any of various types of microprocessors. System 700 also includes data storage features such as a computer usable volatile memory 708, e.g. random access memory (RAM), coupled to bus 704 for storing information and instructions for processors 706A, 706B, and 706C.

System 700 also includes computer usable non-volatile memory 710, e.g. read only memory (ROM), coupled to bus 704 for storing static information and instructions for processors 706A, 706B, and 706C. Also present in system 700 is a data storage unit 712 (e.g., a magnetic or optical disk and disk drive) coupled to bus 704 for storing information and instructions. System 700 also includes an optional alphanumeric input device 714 including alphanumeric and function keys coupled to bus 704 for communicating information and command selections to processor 706A or processors 706A, 706B, and 706C. System 700 also includes an optional cursor control device 716 coupled to bus 704 for communicating user input information and command selections to processor 706A or processors 706A, 706B, and 706C. System 700 of the present embodiment also includes an optional display device 718 coupled to bus 704 for displaying information.

Referring still to FIG. 7, optional display device 718 of FIG. 7 may be a liquid crystal device, cathode ray tube, plasma display device or other display device suitable for creating graphic images and alphanumeric characters recognizable to a user. Optional cursor control device 716 allows the computer user to dynamically signal the movement of a visible symbol (cursor) on a display screen of display device 718. Many implementations of cursor control device 716 are known in the art including a trackball, mouse, touch pad, joystick or special keys on alpha-numeric input device 714 capable of signaling movement of a given direction or manner of displacement. Alternatively, it will be appreciated that a cursor can be directed and/or activated via input from alpha-numeric input device 714 using special keys and key sequence commands.

System 700 is also well suited to having a cursor directed by other means such as, for example, voice commands. System 700 also includes an I/O device 720 for coupling system 700 with external entities. For example, in one embodiment, I/O device 720 is a network adapter for enabling wired or wireless communications between system 700 and an external network such as, but not limited to, the Internet.

Referring still to FIG. 7, various other components are depicted for system 700. Specifically, when present, an operating system 722, applications 724, modules 726, and data 728 are shown as typically residing in one or some combination of computer usable volatile memory 708, e.g. random access memory (RAM), and data storage unit 712. In one embodiment, the present technology for removing media defects in hard drive head testing, for example, is stored as an application 724 or module 726 in memory locations within RAM 708 and memory areas within data storage unit 712.

Example embodiments of the present technology are thus described. Although the subject matter has been described in a language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. A method for testing a hard disk drive comprising:
    rotating a disk of said disk drive more than one revolution;
    determining a number of errors associated with a portion of recordable media associated with said hard disk drive during said rotating;
    comparing said number of determined errors to a threshold number of errors, wherein said threshold number of errors is associated with the number of revolutions said disk is rotated; and
    provided said number of determined errors is greater than said threshold number of errors, determining that said portion of said disk comprises disk defects.

2. The method as described in claim 1 further comprising:
    provided said number of determined errors is less than said threshold number of errors, determining that said number of errors is associated with read head performance.

3. The method of claim 2 further comprising:
    provided said number of determined errors is less than said threshold number of errors, using said number of errors to determine a head error rate associated with said hard disk drive.

4. The method of claim 1 further comprising:
    performing a bit error rate test to determine said number of errors associated with said portion of recordable media.

5. The method of claim 1 further comprising:
    dynamically determining said threshold number of errors concurrently with said determining said number of errors.

6. The method of claim 1 wherein said portion of recordable media is a disk sector.

7. A method for testing a head of hard disk drive comprising:
    receiving a plurality of test results associated with a plurality of portions of recordable media of a hard disk drive;
    comparing said plurality of test results to a threshold value;
    filtering results of said plurality of test results that exceed said threshold value; and
    determining a disk drive head performance based on results of said plurality of said test results that are less than said threshold value.

8. The method of claim 7 further comprising:
    dynamically determining said threshold value based on said plurality of test results.

9. The method as described in claim 7 further comprising:
    determining said results of said plurality of test results that exceed said threshold value are associated with physical defects on said recordable media.

10. The method of claim 7 further comprising:
    performing a bit error rate test to generate said plurality of test results.

11. The method of claim 7 wherein said plurality of test results are associated with a plurality of sectors of said recordable media.

12. The method of claim 7 wherein said filtering is performed by a computer system.

13. A computer readable medium comprising instructions that when executed cause a computer system to perform a method for testing a hard disk drive, said method comprising:
    receiving a plurality of test results associated with a plurality of portions of recordable media of a hard disk drive;
    comparing said plurality of test results to a threshold value;
    filtering results of said plurality of test results that exceed said threshold value; and
    determining a disk drive head performance based on results of said plurality of said test results that are less than said threshold value.

14. The computer readable medium of claim 13 wherein said method further comprises:
    dynamically determining said threshold value based on said plurality of test results.

15. The computer readable medium of claim 13 wherein said method further comprises:
    determining said results of said plurality of test results that exceed said threshold value are associated with physical defects on said recordable media.

16. The computer readable medium of claim 13 wherein said method further comprises:
    performing a bit error rate test to generate said plurality of test results.

17. The computer readable medium of claim 13 wherein said method further comprises:
    determining said results of said plurality of test results that are less than said threshold value are associated with head errors.

18. The computer readable medium of claim 13 wherein said plurality of test results are associated with a plurality of sectors of said recordable media.

* * * * *